United States Patent [19]

Boucher et al.

[11] Patent Number: 4,990,987
[45] Date of Patent: Feb. 5, 1991

[54] OVER-TEMPERATURE SENSOR AND PROTECTOR FOR SEMICONDUCTOR DEVICES

[75] Inventors: R. Wayne Boucher, Dayton, Ohio; William J. Shannon, Portland, Me.

[73] Assignee: GTE Products Corporation, Stamford, Conn.

[21] Appl. No.: 943,105

[22] Filed: Dec. 18, 1986

[51] Int. Cl.$^5$ .................. H01L 23/34; H01L 23/36
[52] U.S. Cl. .................................. 357/28; 357/75
[58] Field of Search .................. 357/28, 87, 81, 75

[56] References Cited

U.S. PATENT DOCUMENTS

| | | | |
|---|---|---|---|
| 4,229,753 | 10/1980 | Bergeron et al. | 357/28 |
| 4,259,685 | 3/1981 | Romano | 357/81 |
| 4,329,701 | 5/1982 | Brenneman | 357/28 |
| 4,571,728 | 2/1986 | Yoshikawa | 357/87 |
| 4,600,968 | 7/1986 | Sekiya et al. | 357/87 |
| 4,689,659 | 8/1987 | Watanabe | 357/28 |
| 4,727,554 | 2/1988 | Watanabe | 357/28 |

FOREIGN PATENT DOCUMENTS 60-46065  3/1985  Japan ................................. 357/28

OTHER PUBLICATIONS

Collins-"Temperature Sensitive Devices"-Electronics World-Oct. 1964.

Primary Examiner—Rolf Hille
Assistant Examiner—S. V. Clark
Attorney, Agent, or Firm—James Theodosopoulos

[57] ABSTRACT

Semiconductors can be damaged by overheating and to prevent such damage, the present invention utilizes a PTC thermistor which is in a heat sensing relationship with the semiconductor. Such thermistors demonstrate a sharp rise in resistance when the body temperature approaches or reaches the anomaly temperature. Electronic circuitry is designed to be sensitive to the resistance increase of the thermistor (caused by the semiconductor's heating) and shuts off the power to the semiconductor before it overheats.

1 Claim, 2 Drawing Sheets

OVER-TEMPERATURE SENSOR AND PROTECTOR FOR SEMICONDUCTOR DEVICES

FIELD OF THE INVENTION

The present invention relates to the protection of semiconductor devices, and particularly to the protection of semiconductor devices that are susceptible to damage from overheating. In particular, the present invention relates to the combination of a semiconductor device and a detector that will continually monitor the temperature of the semiconductor and trigger the disconnection of power when the detector indicates that a predetermined temperature has been reached.

BACKGROUND OF THE INVENTION

Circuit overloads can overheat and thereby destroy semiconductor devices such as power transistors, voltage regulators, triacs and silicon controlled rectifiers (SCRs). Circuit designers are required to ensure that the semiconductor's maximum operating temperature, as specified by the manufacturer, is not exceeded, or risk destruction of the device.

Proper device selection will ensure that the electronic device will not overheat during normal circuit operation. In addition, mechanical devices can be used to prevent overheating, such as heat sinks and cooling fans. Typically, heat sinks are constructed of high thermal conductivity materials (most metals, for instance), and are attached directly to the electronic device to remove the generated heat away from the semiconductor. Cooling fans force the generated heat away from the device. However, for economic or spatial reasons, designs cannot always be incorporated to prevent overheating. Moreover, these mechanisms usually only attend to normal operating conditions.

Under abnormal conditions, especially severe cases such as when the load becomes short-circuited for instance, these protection mechanisms are unable to prevent the device from being destroyed through overheating. In addition, devices attached to a damaged semiconductor can themselves be damaged, electrically and/or mechanically, when a semiconductor burns up. The damage, and the expense in repairing this damage, can be prevented by sensing the temperature of the semiconductor when its temperature approaches or exceeds the specified maximum operating temperature. This invention describes the use of a particular temperature detector element to provide overtemperature protection for semiconductors.

Smaller detector elements are needed for these applications due to their shorter thermal response times, and because there is only a small amount of area available near some semiconductor packages for detector placement. The detector elements most likely to meet this requirement are NTC and PTC thermistors (negative and positive temperature control thermistors), resistive temperature devices (RTDs), and thermocouple junctions, which convert temperature into an electrical parameter (resistance or voltage, for instance). RTDs are very accurate, but are expensive because of the material used, platinum, for instance. Thermocouple junctions require elaborate electronics to perform the conversion from temperature to voltage because the voltage generated is at low levels (millivolts), requiring amplification and noise suppression. We have found that a thermistor is probably the best device available for this application because of its ready availability, reasonable cost and small size.

The difference between the two types of thermistors is that NTCs have a negative temperature coefficient (device resistance decreases as its temperature increases), and PTCs have a positive temperature coefficient of resistance. In addition, the magnitude of these coefficients can be very different for readily available devices, both of which are made of certain types of ceramic. The magnitude of the coefficient (i.e., the slope of the resistance vs. temperature curve) for a PTC is much greater than that of an NTC. This can be important in determining the complexity of the interface electronics between the detector and the semiconductor drive circuitry. The PTC, with its steeper slope, is more sensitive to temperature changes (i.e. its resistance change is larger for a given temperature change), so the necessary electronics would be simpler than that needed for an NTC.

Placement of the detector is very important to the overall success of the protection scheme. One reason is that temperature measurement accuracy increases as the distance between the detector and the semiconductor decreases, since the material between these two devices exhibits some "thermal resistance" that results in a temperature difference between the devices, even in the steady-state. Even more importantly, the response time of the detector to sudden changes in semiconductor temperature will decrease as the distance between the two devices decreases, since the heat transfer time between a semiconductor that becomes suddenly hot to a cooler detector directly depends on the separation distance.

There are other factors needing consideration when designing a housing for the detector itself. The thermal conductivity of the housing material must keep the overall thermal response time of the detector within acceptable limits (the thermal conductivity of the semiconductor package must be accounted for, as well). The detector/semiconductor/heat sink assembly must also be simple in order to keep production assembly costs low. Detector housing designs requiring few additional parts and assembly steps will be preferred.

A complication in selecting the housing material of the detector is that electrical isolation between the detector and the semiconductor is usually necessary. Most power semiconductor packages include a metal piece that not only conducts heat away from the semiconductor die to a heat sink, but is also electrically connected to one of the terminals of the device. Thus, if electrical isolation is needed between the detector and the semiconductor, the detector housing will have to be made of a very low electrically conductive material (plastic or epoxy, for instance) to provide the electrical isolation. These materials have a significantly lower thermal conductivity, however, and result in longer thermal response times. The trade-off between thermal response time and electrical isolation makes the eventual location of the detector even more important, especially for those applications needing electrical isolation and fast response times.

The overall detector package assembly cost can also be affected by these thermal and electrical requirements, since some applications might require a fast enough thermal response that only a metal (electrically conductive) can provide. We have found that the detector itself must be thinly coated with epoxy before it can be inserted into the metal housing so electrical isolation is provided. This configuration will give fast heat transfer capabilities and still provide electrical isolation, but at additional cost because of the extra precoating step needed before insertion into the housing.

In summary, detector selection will depend on the device's temperature sensitivity and measurement accuracy, the device's physical size, the necessary electronic interface circuitry and economic requirements (in both material and assembly costs) of the application, while the detector package design must account for the thermal, electrical and economic needs of the application. The detector and package described by the present invention can prevent the destruction of semiconductors by monitoring their temperature, and through associated electronic circuitry, shut them off when their maximum operating temperature is approached. The resulting package is easy to attach to standard semiconductor packages, and can be produced at reasonable cost.

SUMMARY OF THE PRIOR ART

The art has recognized that semiconductor devices can be damaged by overheating, and such devices are generally protected from overheating by means of mechanical heat sinks which are attached to the semiconductors. The heat sink that is used in combination with the semiconductor provides an equalization of the semiconductor's temperature under normal (expected) operating conditions, but does little or nothing for protection against temperature overruns of the device as carried by abnormal load conditions. The use of temperature sensors to prevent overruns in temperature in various types of equipment is also known to the art and it has been previously recognized that shut-off devices can be used in combination with temperature sensors to prevent damage to the equipment that they monitor.

SUMMARY OF THE INVENTION

Thermistors formed of ceramic materials of positive temperature coefficient cf resistivity (PTCs) are used for applications such as current limiting devices and as self-regulating heaters. When enough electrical current is directed through such materials, self-heating occurs which increases the resistivity of the material. Current flow through the PTC is thereby reduced and the rate of heat generation is decreased. When the rate of heat generation reaches equilibrium with the rate of heat dissipation from the thermistor, the thermistor temperature and resistance stabilize, thereby limiting the thermistor current to some predetermined level. The initial room temperature resistivity of a PTC material and its rate of change with temperature are characteristics of the ceramic material. The materials used in such thermistors are commonly chosen to display a sharp, anomalous increase in resistivity at a particular temperature, thereby stabilizing the heating of the thermistor at that temperature (i.e., a self-limiting heater), while also reducing thermistor current to a very low level at the stabilized temperature.

While the imposition of current upon the thermistor can produce heating within the limits dictated by the anomaly temperature, we have found that such PTC thermistors can also be used to detect changes in temperature of devices disposed closely to them. We have found that if the PTC thermistor is disposed upon and in a heat receiving relationship with a semiconductor which would be damaged by overheating, or upon a heat transmitter associated with the semiconductor, changes in temperature of the semiconductor can be detected by the PTC thermistor and upon detection of a sharp increase in PTC thermistor resistivity caused by an unacceptable increase in temperature, the power to the semiconductor can be removed. PTC thermistors that are chosen to be used with this invention display very low room temperature resistances, but quickly reach high resistances upon being subjected to a temperature which increases their resistivity.

Existing or new circuit designs can be enhanced by incorporating the thermistor into that portion of the circuit which controls the semiconductor, using the thermistor as a temperature sensor to signal the circuit to remove (disconnect) power from the semiconductor in the event of an overtemperature condition. Additional components may be required to incorporate the thermistor into the design. Circuit sensitivity to the thermistor's resistance increase can be implemented in various ways, such as by changing the charge/discharge time of a capacitor, or by having the thermistor as part of a resistive voltage divider network that generates a voltage dependent on the thermistor resistance.

Overtemperature protection of semiconductors should take into account accuracy and response time so as to minimize interference in normal circuit operation, but still provide adequate protection for the device. Both accuracy and response time are related to the distance between the thermistor and the semiconductor.

Positioning the thermistor very close to the semiconductor accomplishes both of these goals, and the package described by this invention puts the thermistor as close as possible to a pre-packaged semiconductor. This high sensitivity is important for proper protection for the semiconductor in that the closer the thermistor is to the device being monitored, the more accurate is the temperature measurement. Heat transfer time from semiconductor to the thermistor is directly proportional to the distance between them, so close proximity will also decrease the response time of the thermistor to semiconductor temperature increases. Fast response time is important by itself because the sooner the semiconductor is shut off, the sooner it begins to cool, and the lower is the maximum temperature reached. For these reasons, the package described yields superior overtemperature protection for semiconductors for both accuracy and response time.

The shut-down temperature is dependent upon the resistance and temperature characteristics of the PTC thermistor, as well as the reference voltage value in the transistor in series with the thermistor. The shut-down temperature is predetermined such that the transistor will be turned off before it exceeds its maximum rated operating temperature through the use of the PTC thermistor of the appropriate temperature value.

BRIEF DESCRIPTION OF THE DRAWINGS

For a fuller understanding of the nature and desired objects of this invention, reference should be made to the following detailed description taken in conjunction with the accompanying drawings of the preferred embodiments of the invention.

FIG. 5 is an exploded view of the combination of a TO-3 packaged semiconductor device, a heat sink and a packaged PTC protector disposed there between.

DESCRIPTION OF THE PREFERRED EMBODIMENTS

Figure 1:
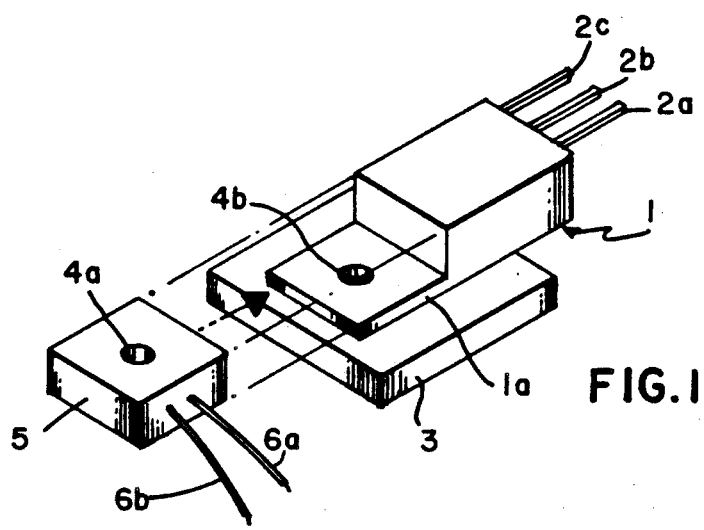
FIG. 1 is an exploded view of the combination of a TO-220 packaged semiconductor device, a heat sink and a packaged protector PTC of the present invention.

A typical semiconductor package 1, for example a TO-220, is shown in FIG. 1. Lead-in prongs 2a, 2b and 2c extend from one end of the package 1 for connection within a circuit. The semiconductor (not shown) within package 1 is susceptible to overheating and can be damaged if overheated. To dissipate the heat that is generated in the semiconductor, a mounting tab 1a extends from one end of the package 1 for connection to a metallic heat sink 3. An aperture 4b is formed in the mounting tab 1a to secure the heat sink 3 through mounting tab 1a to the semiconductor package 1. The housing for the package 1 is preferably a coating of plastic or epoxy resin that has a softening point above about 150° C.

A PTC thermistor package 5 (covered with a similar plastic or epoxy) is disposed upon the mounting tab 1a and an aperture 4a is formed in the center so that the PTC thermistor package 5 can be secured to the assembly of the semiconductor package 1 and the heat sink 3 by means of a bolt or rivet (not shown). A pair of lead-in wires 6a and 6b extend through the packaging of the PTC thermistor and are attached, one to each side of the thermistor, so as to detect changes in resistivity within the body of the ceramic that are produced by changes in the temperature due to its contact with the semiconductor package 1. In the circuit shown in FIG. 3, the lead-in wire 6b is connected to a comparator circuit using a LM339 integrated circuit comparator. The output side of the comparator is connected to the prong 2a so as to shut off the transistor if an increase in resistance (and thus temperature) in the PTC thermistor is detected.

The PTC thermistor is preferably a barium titanate ceramic appropriately doped for a predetermined anomaly temperature. The anomaly temperature is such that there will be a marked increase in resistance when it is approached, which in turn indicates that overheating of the semiconductor is being approached. Selecting an appropriate PTC thermistor ceramic that will detect a predetermined overheating temperature condition thereby to protect the semiconductor is within the skill of the art, since the anomaly temperatures of various composition PTC thermistors are well known.

Figure 2:
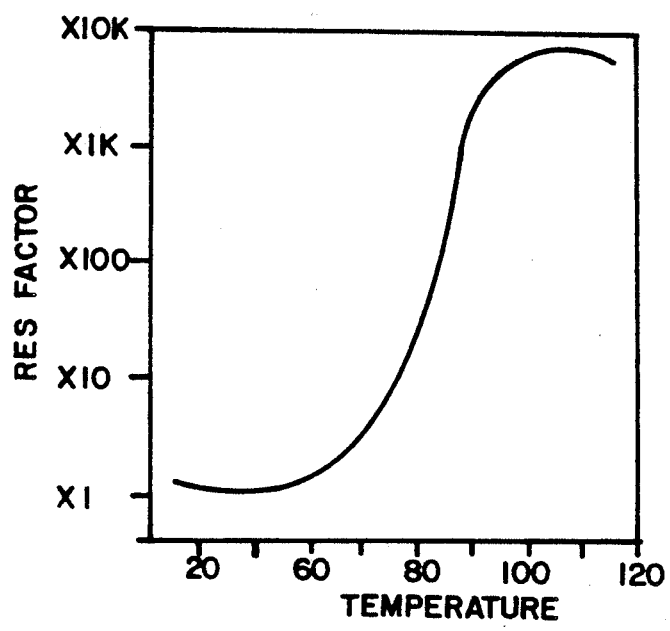
FIG. 2 is a curve indicating the ohmic resistance versus temperature in degrees Celsius of a PTC thermistor that can be used in accordance with the present invention.

As shown in FIG. 2, the sharp rise in resistivity of a PTC ceramic thermistor is shown. The ceramic is a strontium doped barium titanate. When the temperature of the semiconductor is within normal operating ranges, 20° to 70° C., for example, the resistivity is in the neighborhood of 1X ohms. As the temperature of the PTC ceramic is raised because of the rise in the temperature of the semiconductor that it is secured to, the resistance will increase, as can be seen in the Figure in which a 20° rise causes a change in resistivity from a level of X1 ohms to a level of X1 kiloohms. The rise in temperature will trigger the detection and protection circuit, which will turn off the power to the semiconductor.

As another example (with a PTC ceramic thermistor that has an anomaly temperature of approximately 80° to 100° C.), the following table indicates the resistance over a span of 25° to 110° C.

TABLE I

| Temp. (°C.) | Res. (K. ohms) | Temp. (°C.) | Res. (K. ohms) |
|---|---|---|---|
| 25 | 0.400 | 70 | 0.525 |
| 30 | 0.397 | 75 | 0.620 |
| 35 | 0.392 | 80 | 0.786 |
| 40 | 0.391 | 85 | 1.12 |
| 45 | 0.392 | 90 | 1.83 |
| 50 | 0.398 | 95 | 5.29 |
| 55 | 0.410 | 100 | 19.0 |
| 60 | 0.432 | 105 | 62.3 |
| 65 | 0.467 | 110 | 178.0 |

Figure 3:
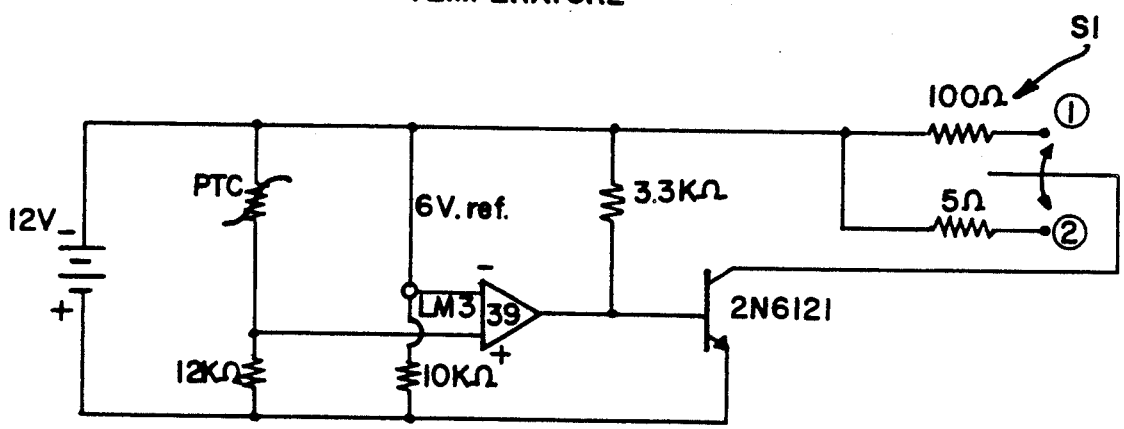
FIGS. 3 and 4 are schematic views of comparator circuits that can be used with different semiconductors to prevent their overheating by means of the temperature detection of the present invention.

Turning now to FIG. 3, an example of a circuit is shown which can detect the change in resistivity of a PTC thermistor due to increases in temperature of the semiconductor that it is disposed upon and thus sensing. The comparator circuit (LM339) compares the thermistor voltage to a reference voltage (6 volts in this case). If the thermistor voltage is less than the reference voltage, the comparator turns on the transistor (2N6121). A 3.3 K ohm resistor is needed to raise the output voltage to the proper level since the comparator has an open collector output. An example of the load that can be used with the present circuit is switch S1 and its related resistors that are exemplary of two conditions of operating the transistor. When switch S1 is in the #1 position, the comparator furnishes enough base current to put the transistor into the saturation region of operation. In this region, the transistor voltage drop is very small with little transistor power dissipation.

If S1 is moved to the #2 position (simulating a fault condition), the comparator can no longer furnish enough base current to keep the transistor in the saturation region. The transistor voltage drop increases substantially thereby increasing the transistor power dissipation and causing the package to heat up. Since the thermistor temperature sensing device of this invention is next to the body of the transistor, it heats up also and its resistance increases markedly when the anomaly temperature is reached. This resistance raises the thermistor voltage. Of course, current to the PTC thermistor is limited to prevent self-$I^2R$ heating which would produce false signals to the comparator. When the temperature becomes high enough, the PTC thermistor voltage becomes large enough to change the comparator output to its low voltage condition. This turns off the transistor since no base current is available for it.

The shut-down temperature is dependent upon the temperature and resistance characteristics of the thermistor, as well as the reference voltage value and the resistor in series with the thermistor. The shut-down temperature is such that the transistor will shut down before its exceeds its maximum rated operating temperature.

Figure 4:
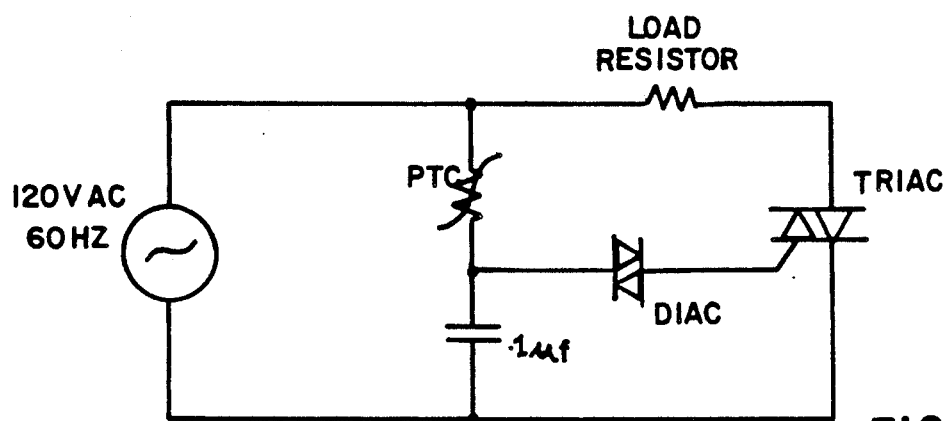

FIG. 4 shows another circuit that is particularly useful for AC power applications requiring a triac or SCR (silicon controlled rectifier). The circuit incorporates a protector package thermally linked to the semiconductor device so as to detect an overtemperature condition. Normal circuit operation proceeds when the PTC thermistor is in its low-resistance (low temperature) state. Electrical current flows through the thermistor, charging the capacitor. When the voltage across the capacitor reaches the breakdown voltage of the diac (or similar avalanching trigger device), the trigger conducts current thereby causing the semiconductor device (triac or SCR) to switch closed and allowing current to flow through the load. The semiconductor will remain in the conductive state for the remainder of this AC half-cycle, and shut off when the source voltage passes through zero volts. The above-described events are repeated during the next half-cycle if a triac is being used, or are repeated during the next full-cycle if a SCR is being used. Eventually, the semiconductor/PTC thermistor combination reaches thermal equilibrium such that circuit operation proceeds normally under normal (expected) load conditions.

Overtemperature protection is needed if the semiconductor becomes overloaded by a fault condition. An example of this would be a stalled motor condition, where the circuit load is the motor. A stalled motor draws appreciably more current than one that is rotating. The semiconductor dissipates more power and heats up due to the abnormally high current flowing through it, so the temperature of the device rises. Left unchecked, the semiconductor could eventually burn up. However, since the thermistor package described by this invention is thermally connected to the semiconductor, the thermistor temperature rises along with the semiconductor. The resulting resistance increase of the thermistor prevents the capacitor from charging to a voltage high enough to activate the trigger device, and the semiconductor will not be switched closed.

Figure 5:
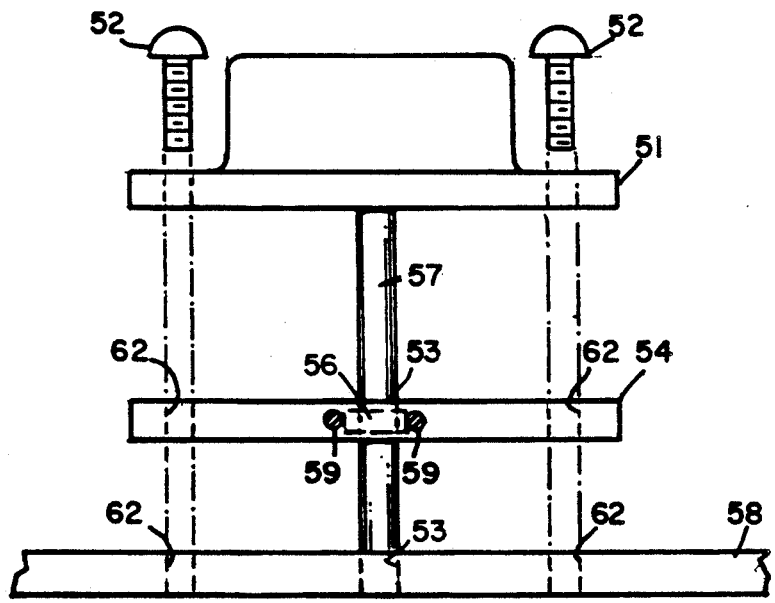

As shown in FIG. 5, a TO-3 semiconductor package 51 is screwed on to a substrate (not shown) with mounting screws 52. A TO-3 PTC protector package 54 is disposed directly beneath the semiconductor package 51. The PTC protector package 54 can be formed with a PTC thermistor 56 encapsulated within a suitable plastic material having a decomposition temperature that is higher than any temperature which the PTC 56 or the semiconductor package 51 will see. Appropriately disposed holes 53 are formed in the protector package 54 to allow for the placement of leads 57 (only one of which is shown since the two are disposed on the same plane) from the semiconductor package 51. Holes 62 are formed in the protector package 54 to allow screws 52 to pass through it for mounting the semiconductor package 51 upon the substrate (not shown). A heat sink 58 formed of steel, copper or other appropriate heat conducting metal is disposed between the PTC protector package 54 and the substrate. Again, appropriate holes 53 and 62 are formed in the heat sink 58 for the screws 52 and the leads 57. The leads 59 to the PTC pass through holes in the PTC protector package and are connected to the power supply and the semiconductor package 51 in such a way that upon attainment of a predetermined anomaly temperature and the concurrent increase in resistance within the PTC, the semiconductor in package 51 will be shut off.

It is apparent that modifications and changes can be made within the spirit and scope of the present invention, but it is our intention, however, only to limited by the scope of the appended claims.

As our invention, we claim:

1. In combination with a heat generating semiconductor device that is susceptible to damage when overheated, said combination comprising:

a semiconductor package and means to provide power to said semiconductor in said package;

a mounting tab extending from said semiconductor package, said mounting tab forming a heat sink, said mounting tab being disposed in a heat receiving relationship to said semiconductor whereby to be heated by heat generated by said semiconductor;

a PTC thermistor attached to said mounting tab, said PTC thermistor being in a heat receiving relationship with said mounting tab, said PTC thermistor having an anomoly temperature below the temperature which would cause damage to said semiconductor during its operation, whereby said PTC thermistor changes its resistance in response to the changes in temperature occurring in said semiconductor;

means electrically insulating said semiconductor from said PTC thermistor;

means to detect changes in resistance in said PTC thermistor due to an approach of said anomoly temperature, whereby to detect changes in the operating temperature of said semiconductor; and means to turn off the power to said semiconductor upon detection of a predetermined resistance in said PTC thermistor indicative of a predetermined operating temperature of said semiconductor which would damage said semiconductor.

* * * * *